(12) United States Patent
Jang

(10) Patent No.: US 8,866,379 B2
(45) Date of Patent: Oct. 21, 2014

(54) DISPLAY DEVICE AND METHOD OF MANUFACTURING THE SAME

(71) Applicant: Samsung Display Co., Ltd., Yongin-si (KR)

(72) Inventor: Nam-Jin Jang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/759,988

(22) Filed: Feb. 5, 2013

(65) Prior Publication Data

US 2014/0062291 A1   Mar. 6, 2014

(30) Foreign Application Priority Data

Aug. 30, 2012 (KR) .................... 10-2012-0095958

(51) Int. Cl.
  *H05B 33/10* (2006.01)
  *H05B 33/02* (2006.01)
  *G09F 9/30* (2006.01)

(52) U.S. Cl.
  CPC ............... *H05B 33/02* (2013.01); *H05B 33/10* (2013.01); *G09F 9/30* (2013.01)
  USPC ............................. 313/504; 313/507; 445/24

(58) Field of Classification Search
  USPC ............... 313/498–512; 445/23–25; 427/66, 427/532–535, 539; 257/40, 98
  See application file for complete search history.

(56) References Cited

U.S. PATENT DOCUMENTS

| 7,259,505 | B2 * | 8/2007 | Cok ............................. 313/112 |
| 2007/0173167 | A1 * | 7/2007 | Choi .............................. 445/25 |
| 2012/0105340 | A1 * | 5/2012 | Beom et al. ................... 345/173 |
| 2013/0069085 | A1 * | 3/2013 | Kang et al. ..................... 257/88 |

FOREIGN PATENT DOCUMENTS

| JP | 2009-237394 A | 10/2009 |
| KR | 10-2011-0032901 | 3/2011 |
| KR | 10-2011-0094455 | 8/2011 |

* cited by examiner

*Primary Examiner* — Tracie Y Green
(74) *Attorney, Agent, or Firm* — Christie, Parker & Hale, LLP

(57) ABSTRACT

A display device and a method of manufacturing the same are provided. The display device includes: a display panel; a cover on the display panel; an adhesive on at least one of the cover or the display panel to attach the cover to the display panel; and a flow prevention member on at least one of the display panel or the cover, wherein the adhesive member is arranged at an inner space of the flow prevention member.

17 Claims, 6 Drawing Sheets

DISPLAY DEVICE AND METHOD OF MANUFACTURING THE SAME

CROSS-REFERENCE TO RELATED PATENT APPLICATION

This application claims priority to and the benefit of Korean Patent Application No. 10-2012-0095958, filed on Aug. 30, 2012, in the Korean Intellectual Property Office, the disclosure of which is incorporated herein in its entirety by reference.

BACKGROUND

1. Field

One or more embodiments of the present invention relate to a display device and a method of manufacturing the same.

2. Description of the Related Art

Display devices are devices that display images toward the outside and are used in various fields. In detail, display devices are variously used in various fields that render information through images. Examples of such uses are screens of portable terminals, televisions, or monitors.

A display device may include a display panel and a cover. In this regard, the cover may be attached to a surface of the display panel to protect the display panel from external impacts. In particular, the cover may be coupled to the display panel through an attachment process using a resin.

When the cover is attached to the display panel, the resin may be exposed to the outside or may spread onto a part where the resin may be unnecessary. To prevent the spreading or exposure of the resin, an anti-friction (AF) coating may be performed on the cover before coating with the resin.

SUMMARY

One or more embodiments of the present invention provide a display device that has high reliability and is manufactured by using a simplified manufacturing method, and a method of manufacturing the display device.

According to an aspect of the present invention, there is provided a display device including: a display panel; a cover on the display panel; an adhesive on at least one of the cover or the display panel to attach the cover to the display panel; and a flow prevention member on at least one of the display panel or the cover. Here, the adhesive is at an inner space of the flow prevention member.

The flow prevention member may be at a periphery of at least one of the display panel or the cover.

The flow prevention member may include: a first flow prevention member on the display panel; and a second flow prevention member on the cover and conformably coupled to the first flow prevention member.

At least one of the first flow prevention member or the second flow prevention member may include a coupling member; and the other one of the first flow prevention member or the second flow prevention member may have a position determination member that is coupled to the coupling member.

The flow prevention member may be attached to at least one of the display panel or the cover in a tape form.

The display panel may include: a first substrate; an emission unit on the first substrate; a second substrate coupled to the first substrate by a sealant that seals the emission unit from the outside; and a light polarization member attached to a surface of the second substrate.

The display panel may further include a touch pattern on the second substrate that is configured to enable touch recognition.

The cover may include glass.

According to another aspect of the present invention, a method of manufacturing a display device includes: attaching a flow prevention member having an inner space to at least one of a display panel or a cover; placing an adhesive member into the inner space of the flow prevention member; and attaching the cover to the display panel by compression.

The adhesive member may be radially applied from a center of the at least one of the display panel or the cover to which the flow prevention member is attached.

The attaching of the flow prevention member may include: arranging a first flow prevention member on the display panel; and arranging a second flow prevention member on the cover.

The method may further include inserting one of the first flow prevention member or the second flow prevention member into the other one of the first flow prevention member or the second flow prevention member.

The first flow prevention member and the second flow prevention member may be respectively arranged on facing surfaces of the display panel and the cover.

The flow prevention member may be arranged on a periphery of at least one of the display panel or the cover.

The display panel may include: a first substrate; an emission unit on the first substrate; a second substrate coupled to the first substrate by a sealant that seals the emission unit from the outside; and a light polarization member attached to a surface of the second substrate.

The display panel may further include a touch pattern on the second substrate and configured to enable touch recognition.

The cover may include glass.

BRIEF DESCRIPTION OF THE DRAWINGS

The above and other features and aspects of the present invention will become more apparent from the detailed description of embodiments thereof with reference to the attached drawings, in which.

DETAILED DESCRIPTION

Hereinafter, the present invention will be described more fully with reference to the accompanying drawings, in which exemplary embodiments of the invention are shown. The invention may, however, be embodied in many different forms and should not be limited to the embodiments set forth herein; rather these embodiments are provided so that this disclosure will be thorough and complete, and will fully convey the concept of the invention to one of ordinary skill in the art. The terminology used herein is for the purpose of describing particular embodiments only and is not intended to be limiting of exemplary embodiments of the inventive concept.

As used herein, the singular forms "a", "an", and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof. It will be understood that, although the terms first, second, third, etc. may be used herein to describe various elements, these elements should not be limited by these terms. These terms are only used to distinguish one element from another element. Also, expressions such as "at least one of," when preceding a list of elements, modify the entire list of elements and do not modify the individual elements of the list.

Figure 1:
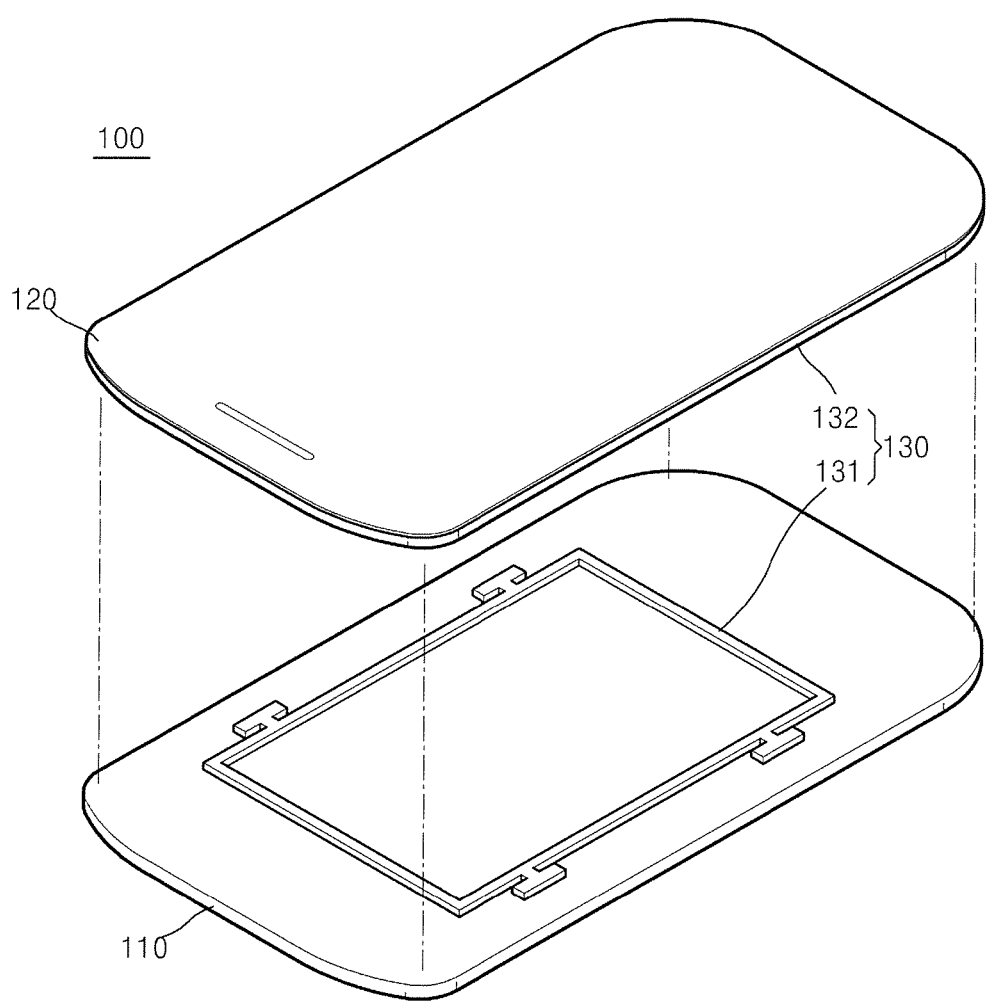
FIG. 1 is an exploded perspective view illustrating a display device according to an embodiment of the present invention.

FIG. 1 is an exploded perspective view illustrating a display device 100 according to an embodiment of the present invention.

Referring to FIG. 1, the display device 100 includes the display panel 110. The display panel 110 may include one of various devices. For example, the display panel 110 may include a liquid crystal display (LCD) panel or an organic light-emitting diode (OLED) panel. Hereinafter, for convenience of explanation, the following description will be made with reference to embodiments of the present invention where the display panel 110 includes an organic light-emitting panel.

In addition, the display device 100 may include a cover or (glass cover) 120 provided on the display panel 110. In this regard, the glass cover 120 may be formed of a glass material.

In addition, the display device 100 may include an adhesive member (or adhesive) (not shown) provided on at least one of the glass cover 120 or the display panel 110. In one or more embodiments, the adhesive member may be formed of a resin. The adhesive member enables the glass cover 120 to be attached to the display panel 110 (i.e., the adhesive member attaches (or secures) the glass cover 120 to the display panel 110).

The display device 100 may include a flow prevention member 130 that has an inner space in which the adhesive member is arranged (or disposed) and that is provided on at least one of the display panel 110 or the glass cover 120. For example, in one embodiment, the flow prevention member 130 may be provided on only the display panel 110. Alternatively, in another embodiment, the flow prevention member 130 may be provided only on the glass cover 120. Alternatively, in yet another embodiment, the flow prevention member 130 may be provided on the display panel 110 and the glass cover 120. Hereinafter, for convenience of explanation, the following description will be made with reference to embodiments where the flow prevention member 130 is provided on the display panel 110 and the glass cover 120.

The flow prevention member 130 may include a plurality of flow prevention members. For example, the flow prevention member 130 may include a first flow prevention member 131 provided on the display panel 110. In addition, the flow prevention member 130 may include a second flow prevention member 132 provided on the glass cover 120.

According to an embodiment of the present invention, the first flow prevention member 131 and the second flow prevention member 132 may be arranged (or disposed) to face each other. For example, the first flow prevention member 131 may be provided on a surface of the display panel 110 facing the glass cover 120, and the second flow prevention member 132 may be provided on a surface of the glass cover 120 facing the display panel 110.

In addition, the first flow prevention member 131 and the second flow prevention member 132 may conform (or correspond) to each other. For example, the first flow prevention member 131 and the second flow prevention member 132 may be formed such that one of the first flow prevention member 131 or the second flow prevention member 132 is inserted into the other one of the first flow prevention member 131 or the second flow prevention member 132.

For example, the first flow prevention member 131 and the second flow prevention member 132 may each have a space therein. In particular, the first flow prevention member 131 and the second flow prevention member 132 may each have a space therein to form a cell, so that the inside of the cell is substantially (or completely) blocked from the outside of the cell.

In this embodiment, when the first flow prevention member 131 is inserted into the second flow prevention member 132, an outer surface of the first flow prevention member 131 may contact an inner surface of the second flow prevention member 132. Alternatively, when the second flow prevention member 132 is inserted into the first flow prevention member 131, an outer surface of the second flow prevention member 132 may contact an inner surface of the first flow prevention member 131.

However, for convenience of explanation, the following description will be made with reference to embodiments of the present invention where the first flow prevention member 131 is inserted into the second flow prevention member 132.

The display device 100 may further include a coupling member 140 that is formed on at least one of the first flow prevention member 131 or the second flow prevention member 132. In addition, the display device 100 may include a position determination member (not shown) that is formed at the other one of the first flow prevention member 131 or the second flow prevention member 132 and that is coupled to (or configured to be coupled to) the coupling member 140.

In this regard, the coupling member 140 and the position determination member may be formed in various shapes. For example, the coupling member 140 may be formed as a protrusion, and the position determination member may be formed as a coupling hole into which the protruding coupling member 140 is inserted. Alternatively, the coupling member 140 may be formed with an uneven shape and the position determination member may also be formed to correspond to the uneven shape, so that the coupling member 140 and the position determination member may conform to each other. However, for convenience of explanation, the following description will be made with reference to an embodiment of the present invention where the coupling member 140 is formed as a protrusion and the position determination member is formed as a coupling hole.

Figure 2:
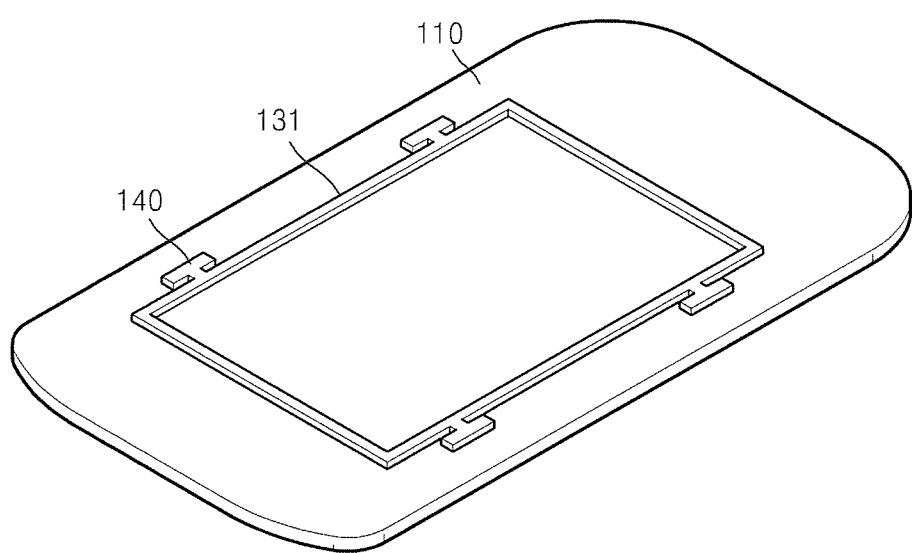
FIG. 2 is a perspective view of a display panel and a first flow prevention member illustrated FIG. 1.
Figure 3:
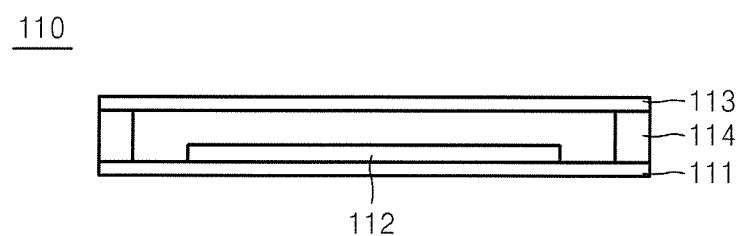
FIG. 3 is a cross-sectional view of the display panel illustrated FIG. 2.
Figure 4:
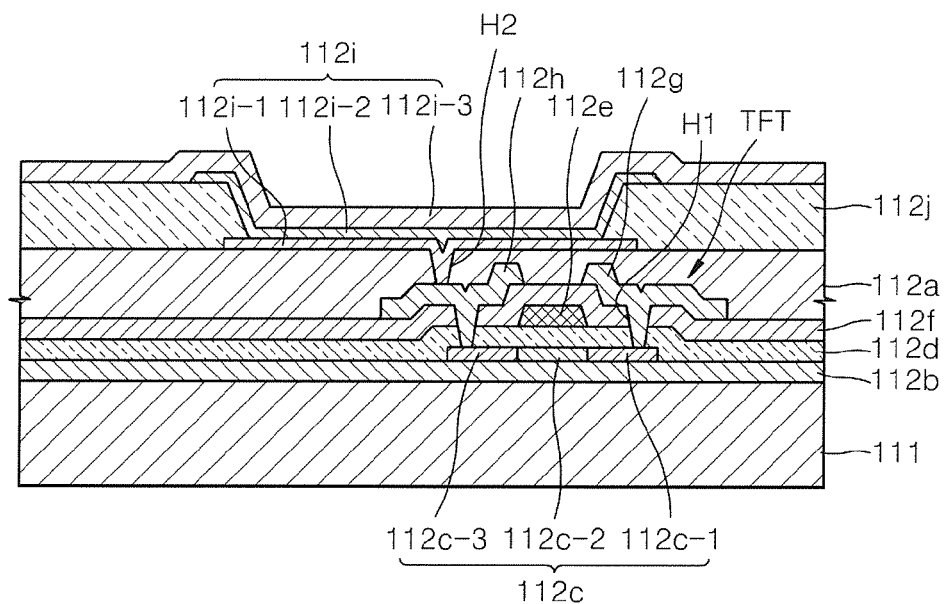
FIG. 4 is a schematic cross-sectional view of a first substrate and an emission unit of the display panel illustrated in FIG. 3.

FIG. 2 is a perspective view of the display panel 110 and the first flow prevention member 131 illustrated FIG. 1. FIG. 3 is a schematic cross-sectional view of the display panel 110 illustrated FIG. 2. FIG. 4 is a cross-sectional view of a first substrate 111 and an emission unit 112 of the display panel 110 illustrated in FIG. 3.

Referring to FIGS. 2 to 4, the display panel 110 may include the first substrate 111. In addition, the display panel 110 may include the emission unit 112 formed on the first substrate 111.

The display panel 110 may include a second substrate 113 that is coupled to the first substrate 111 by using a sealant 114 to seal the emission unit 112 from the outside. In addition, the display panel 110 may include a light polarization member (not shown) attached to a surface of the second substrate 113.

The emission unit 112 may be formed on the first substrate 111. As shown in FIG. 4, the emission unit 112 may include a thin film transistor (TFT), a passivation film 112a covering the TFT, and an organic light-emitting diode (OLED) 112i formed on the passivation film 112a.

The first substrate 111 may be formed of a glass material. However, the present embodiment is not limited thereto, and the first substrate 111 may instead be formed of a plastic material or a metal material, such as steel use stainless (SUS) or titanium (Ti).

A buffer layer 112b formed of an organic compound and/or an inorganic compound such as silicon oxide (SiOx) (x≥1) or silicon nitride (SiNx) (x≥1) may be formed on a top surface of the first substrate 111.

An active layer 112c having a predetermined pattern is formed on the buffer layer 112b, and then is covered by a gate insulating layer 112d. The active layer 112c includes a source region 112c-1 and a drain region 112c-3, and a channel region 112c-2 disposed between the source region 112c-1 and the drain region 112c-3.

The active layer 112c may be formed by forming an amorphous silicon film on the buffer layer 112b, crystallizing the amorphous silicon film to form a polycrystalline silicon film, and patterning the polycrystalline silicon film. The source and drain regions 112c-1 and 112c-3 of the active layer 112c are doped with impurities that vary according to a TFT type, such as, a driving TFT (not shown) or a switching TFT (not shown).

A gate electrode 112e (corresponding to the channel region 112c-2 of the active layer 112c) and an interlayer insulating layer 112f (covering the gate electrode 112e) are formed on a top surface of the gate insulating layer 112d.

After a contact hole is formed in the interlayer insulating layer 112f and the gate insulating layer 112d, a source electrode 112g and a drain electrode 112h are formed on the interlayer insulating layer 112f to respectively contact the source region 112c-1 and the drain region 112c-3.

Since a reflective film is formed concurrently (or simultaneously) with the source and drain electrodes 112g and 112h, each of the source and drain electrodes 112g and 112h may be formed to have a thickness that enables reflection of light by using high electrical conductivity. Each of the source and drain electrodes 112g and 112h may be formed of a metal material such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound thereof.

In FIG. 4, the passivation film 112a is formed on the TFT and the reflective film, and a pixel electrode 112i-1 of the OLED 112i is formed on the passivation film 112a. The pixel electrode 112i-1 contacts the drain electrode 112h of the TFT via a via-hole H2 formed in the passivation film 112a. The passivation film 112a may be formed of an inorganic material and/or an organic material and may have a single-layer structure or a multi-layer structure. The passivation film 112a may be formed as a planarization layer, which has a planarized upper surface regardless of the curve of a lower film disposed thereunder, or a layer that is curved corresponding to the curve of a lower film disposed thereunder. The passivation film 112a may be formed of a transparent insulating material so as to achieve a resonance effect.

After the pixel electrode 112i-1 is formed on the passivation film 112a, a pixel-defining film 112j may be formed to cover the pixel electrode 112i-1 and the passivation film 112a by using an organic material and/or an inorganic material, and is opened to expose a portion of the pixel electrode 112i-1.

In addition, an organic light-emitting layer 112i-2 and a counter electrode 112i-3 are formed on at least the pixel electrode 112i-1.

The pixel electrode 112i-1 may function as an anode and the counter electrode 112i-3 may function as a cathode, or vice versa.

The pixel electrode 112i-1 may be formed of a material having a high work function such as indium tin oxide (ITO), indium zinc oxide (IZO), indium (III) oxide ($In_2O_3$), or zinc oxide (ZnO).

The counter electrode 112i-3 may be formed of a metal material having a low work function such as Ag, Mg, Al, Pt, Pd, Au, Ni, Nd, Ir, Cr, Li, Ca, or a compound thereof. For example, the counter electrode 112i-3 may be formed of Mg, Ag, or Al to have a small thickness so as to function as a semi-transmissive reflective film. Accordingly, the counter electrode 112i-3 may allow light to transmit therethrough after optical resonance.

The pixel electrode 112i-1 and the counter electrode 112i-3 may be insulated from each other by the organic light-emitting layer 112i-2, and may apply voltages of different polarities to the organic light-emitting layer 112i-2 for the organic light-emitting layer 138b to emit light.

The organic light-emitting layer 112i-2 may be formed of a low molecular weight organic material or a polymer organic material. If the organic light-emitting layer 112i-2 is formed of a low molecular weight organic material, the light-emitting layer 112i-2 may include a hole injection layer (HIL), a hole transport layer (HTL), an emission layer (EML), an electron transport layer (ETL), and an electron injection layer (EIL), each of which may have a single-layer structure or a multi-layer structure. Examples of low molecular weight organic material are copper phthalocyanine (CuPc), N,N'-Di(naphthalene-1-yl)-N,N'-diphenyl-benzidine (NPB), and tris-8-hydroxyquinoline and aluminum (Alq3). The low molecular weight organic material may be formed by using vacuum deposition. In this case, the HIL, the HTL, the ETL, and the EIL are common layers and may be commonly shared by red, green, and blue pixels. Accordingly, the common layers, such as the counter electrode 112i-3, may be formed to cover all pixels.

If the organic light-emitting layer 138b is formed of a polymer weight organic material, the organic light-emitting layer 138b may have a structure including an HTL and an EML. In this case, the HTL may be formed of poly(3,4-ethylenedioxythiophene) (PEDOT) and the EML may be formed of a polymer organic material, such as polyphenylene vinylene (PPV) or polyfluorene. The polymer organic material may be formed by using screen printing or inkjet printing.

Such organic layers are not limited thereto, and various other examples may instead be applied thereto.

The second substrate 113 may be formed in a similar manner as described with reference to the first substrate 111. For example, the second substrate 113 may be formed of a glass material, which is also used in forming the first substrate 111. However, a material for forming the second substrate 113 is not limited thereto, and for example, a plastic material may instead be used in forming the second substrate 113.

In addition, a sealant 114 may be disposed between the first substrate 111 and the second substrate 113. The sealant 114 may couple the first substrate 111 to the second substrate 113, and may prevent permeation of air and/or water molecules into the emission unit 112 from the outside.

A light polarization member (not shown) may be provided on the second substrate 113. The light polarization member may be attached as a film to the second substrate 113. Alternatively, the light polarization member may be applied as a light-polarizing material to the second substrate 113.

The display panel 110 may include a touch pattern (not shown) that is formed on the second substrate 113 and enables touch recognition. The touch pattern may be formed on the surface of the second substrate 113. For example, the touch pattern may be disposed as a panel on the second substrate 113, or may be formed as a pattern on the surface of the second substrate 113. The touch pattern may be formed on the second substrate 113 and the light polarization member may be provided on the touch pattern.

For convenience of explanation, the following description will be made with reference to embodiments of the present invention where the touch pattern is not formed on the surface of the second substrate 113.

The first flow prevention member 131 may be provided on the display panel 110. In one or more embodiments, the first flow prevention member 131 is provided on the second substrate 113. For example, the first flow prevention member 131 may be provided on the second substrate 113 on which the light polarization member is formed. In particular, the first flow prevention member 131 may be attached to the light polarization member in a tape form.

The first flow prevention member 131 may be attached to the light polarization member in such a manner that the first flow prevention member 131 covers an edge of the light polarization member. In detail, the first flow prevention member 131 may be attached to a portion of the light polarization member corresponding to the sealant 114 arranged (or disposed) under the light polarization member. In this regard, the first flow prevention member 131 may protrude from the light polarization member, thereby forming the inner space thereof. In particular, the first flow prevention member 131 may be attached to the light polarization member in such a way that the first flow prevention member 131 covers the light polarization member to block the inner space of the first flow prevention member 131 from the outside.

In addition, the first flow prevention member 131 may include the coupling member 140. In this regard, the coupling member 140 may protrude from an outer surface of the first flow prevention member 131.

The coupling member 140 may have various shapes. For example, the coupling member 140 may be formed in a T-shape or a round protrusion.

For convenience of explanation, the following description will be with reference to embodiments of the present invention where the coupling member 140 is formed in a T-shape. However, the structure of the coupling member 140 is not limited thereto, and the coupling member 140 may have any one of various structures that enable the first flow prevention member 131 to be coupled to the second flow prevention member 132 so as to align the first flow prevention member 131 and the second flow prevention member 132.

The coupling member 140 may include a plurality of coupling members, and the coupling members 140 may be spaced apart from each other on the outer surface of the first flow prevention member 131.

Figure 5:
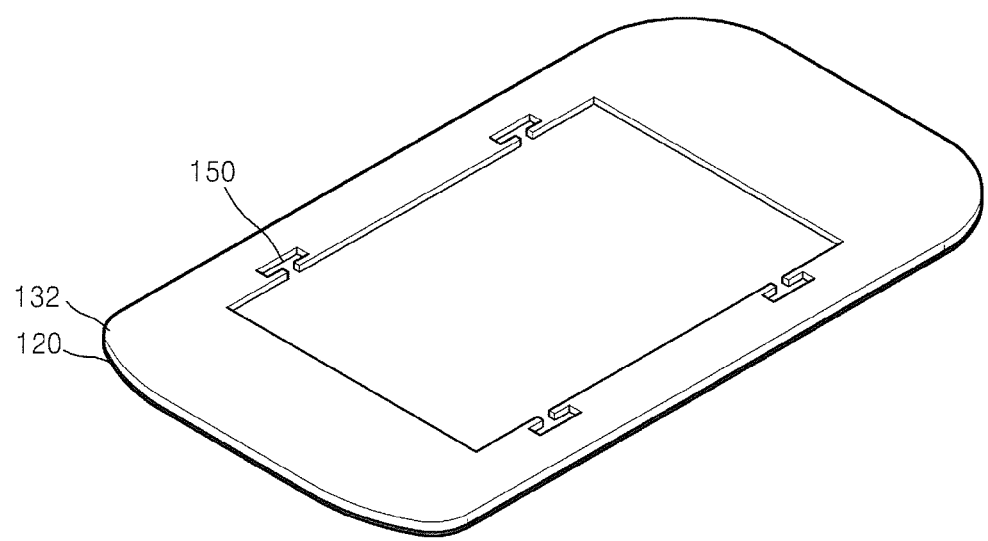
FIG. 5 is a perspective view of a glass cover and a second flow prevention member illustrated in FIG. 1.

FIG. 5 is a perspective view of the glass cover 120 and the second flow prevention member 132 illustrated in FIG. 1.

Referring to FIG. 5, the glass cover 120 may be formed of a glass material as described above. The glass cover 120 may be formed to have a size that is equal to or greater than that of the second substrate 113 of the display panel 110.

In addition, the second flow prevention member 132 may be formed on the glass cover 120. The second flow prevention member 132 may have an inner space and may cover an edge (or periphery) of the glass cover 120.

In addition, the second flow prevention member 132 may be attached in a tape form to the glass cover 120. The second flow prevention member 132 may be attached to the glass cover 120, thereby forming an inner space. In addition, the first flow prevention member 131 may be inserted into the inner space of the second flow prevention member 132. In this regard, the inner surface of the second flow prevention member 132 may conform to the outer surface of the first flow prevention member 131, and thus, when the first flow prevention member 131 is inserted into the second flow prevention member 132, the first flow prevention member 131 may conform to the second flow prevention member 132.

In addition, a position determination member 150 may be formed with the second flow prevention member 132. For example, the position determination member 150 may be formed as a coupling hole into which the coupling member 140 is inserted. However, the position determination member 150 is not limited thereto, and may have any one of various shapes that allow the position determination member 150 to be coupled to the coupling member 140. However, for convenience of explanation, the following description will be made with reference to an embodiment of the present invention where the position determination member 150 is formed as a coupling hole.

The position determination member 150 may correspond (or conform) to the outer surface of the coupling member 140 so that the coupling member 140 is inserted thereinto. In this regard, like the coupling member 140, the position determination member 150 may be one of a plurality of position determination members 150. The position determination members 150 may be spaced apart from each other at intervals so as to respectively correspond to the coupling members 140.

A method of manufacturing the display device 100 will now be described in detail.

Figure 6A:
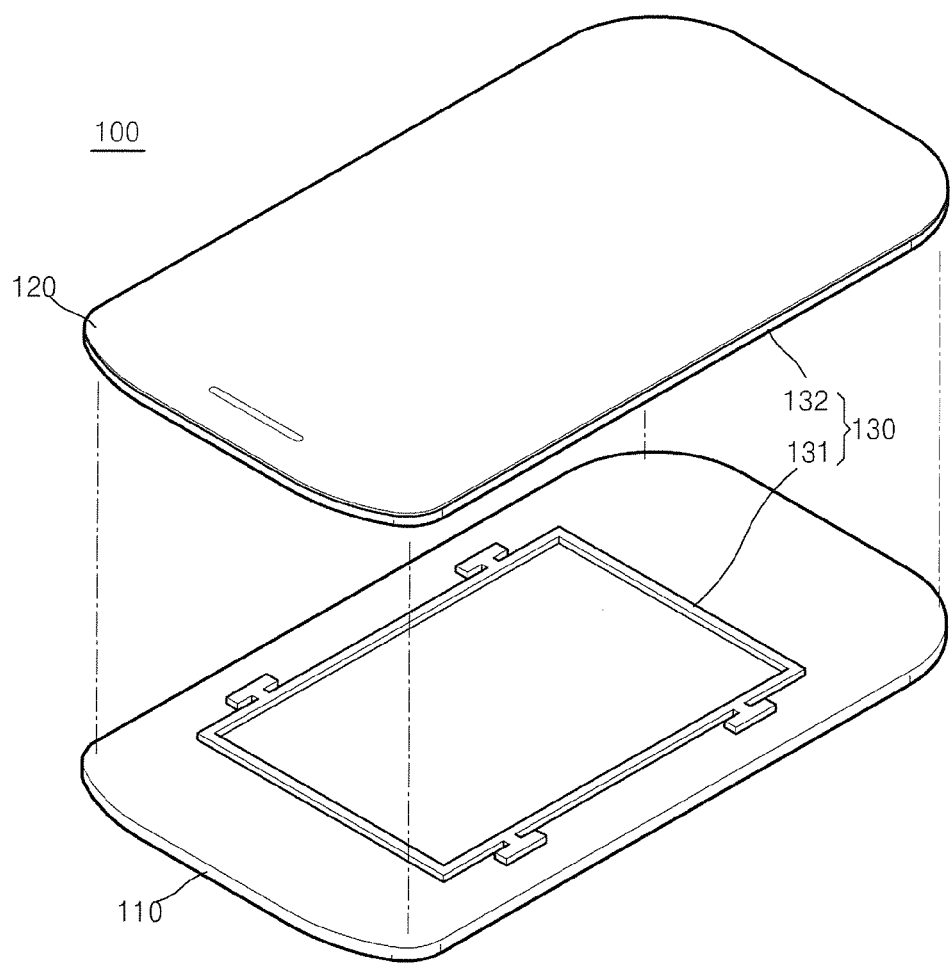
FIGS. 6A to 6C are views illustrating a method of manufacturing the display device of FIG. 1, according to an embodiment of the present invention.
Figure 6B:
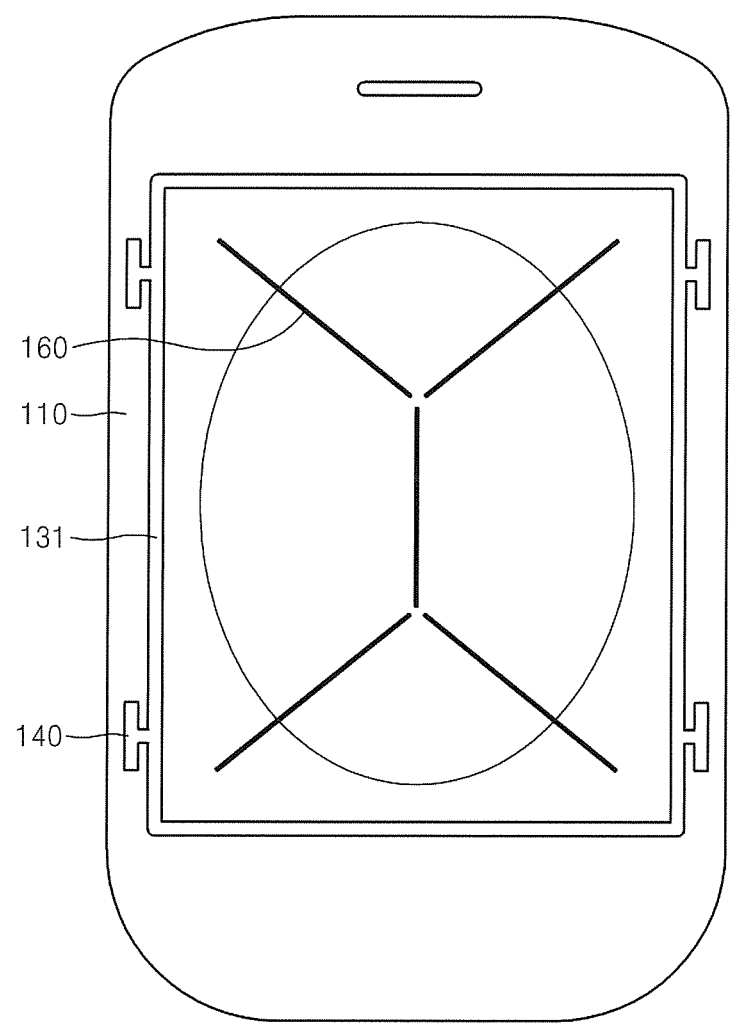
Figure 6C:
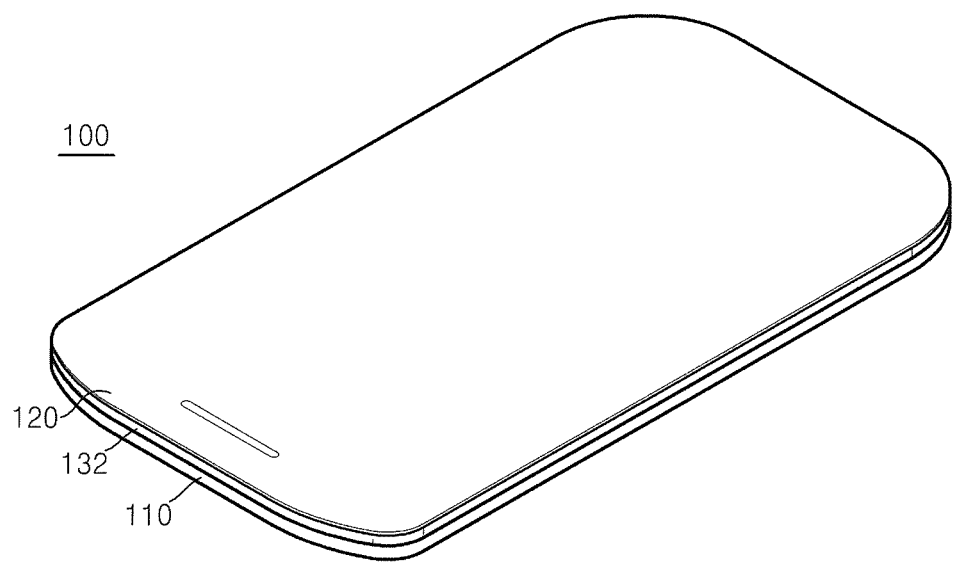

FIGS. 6A to 6C are views illustrating a method of manufacturing the display device of FIG. 1, according to an embodiment of the present invention.

Referring to FIG. 6, the display panel 110 and the glass cover 120 may be manufactured to manufacture the display device 100. In this regard, a method of manufacturing the display panel 110 and the glass cover 120 is not described in detail herein because the method is well known in the art.

Once the manufacturing of the display panel 110 and the glass cover 120 is completed, the flow prevention member 130 is provided on at least one of the display panel 110 or the glass cover 120. Hereinafter, for convenience of explanation, the following description will be made with reference to embodiments of the present invention where the flow prevention member 130 includes a plurality of flow prevention members that are provided on the display panel 110 and the glass cover 120.

The first flow prevention member 131 may be provided (or arranged or formed) on the display panel 110. In particular, as described above, the first flow prevention member 131 may be attached in a tape form to the light polarization member. For example, the first flow prevention member 131 may be attached such that it covers the edge (or periphery) of the display panel 110 corresponding to a portion of the light polarization member under which the sealant 114 is located.

In addition, the second flow prevention member 132 is provided (or arranged or formed) on the glass cover 120. In one embodiment, the second flow prevention member 132 is formed on the glass cover during the performing of attaching of the first flow prevention member 131. The second flow prevention member 132 may be provided (or attached) in a similar manner to that of the first flow prevention member 131.

In detail, as described above, the second flow prevention member 132 may be attached to a surface of the glass cover 120 in a tape form. In this regard, the second flow prevention member 132 may have an inner space, and may be attached to the glass cover 120 in such a way that the second flow prevention member 132 covers an edge (or periphery) of the glass cover 120 to block the inner space from the outside.

In addition, once the manufacturing of the display panel 110 and the glass cover 120 is completed, the adhesive member 160 may be placed in the inner space of the first flow prevention member 131 or the inner space of the second flow prevention member 132. The adhesive member 160 may be placed in the inner space of the first flow prevention member 131 or the inner space of the second flow prevention member 132 according to the size of the inner space of the first flow prevention member 131 and the second flow prevention member 132.

For example, when the first flow prevention member 131 is configured to be arranged inside the second flow prevention member 132, the adhesive member 160 may be placed in the inner space of the first flow prevention member 131. Alternatively, when the second flow prevention member 132 is configured to be arranged inside the first flow prevention member 131, the adhesive member 160 may be placed in the inner space of the second flow prevention member 132.

The placing of the adhesive member 160 into the inner space of the first flow prevention member 131 is similar to the placing of the adhesive member 160 into the inner space of the second flow prevention member 132. Accordingly, for convenience of explanation, the following description will be made with reference to embodiments of the present invention where the adhesive member 160 is placed in the inner space of the first flow prevention member 131.

When the adhesive member 160 is placed in the inner space of the first flow prevention member 131, the adhesive member 160 may be applied on a surface of the display panel 110. In one or more embodiments of the present invention, the adhesive member 160 may be radially applied from a center of the display panel 110. For example, the adhesive member 160 may be applied in a V-shape, and may be applied on upper and lower, and left and right sides of the display panel 110.

Once the applying of the adhesive member 160 is completed, the display panel 110 and the glass cover 120 may be aligned to be parallel to each other. In this regard, the display panel 110 and the glass cover 120 may be aligned by using locations of the first flow prevention member 131 and the second flow prevention member 132.

In detail, as described above, since the first flow prevention member 131 is inserted into the inner space of the second flow prevention member 132, the display panel 110 and the glass cover 120 may be aligned such that the outer surface of the first flow prevention member 131 contacts the inner surface of the second flow prevention member 132.

In addition, when the coupling member 140 and the position determination member 150 are formed, the display panel 110 and the glass cover 120 may be aligned such that the coupling member 140 corresponds to the position determination member 150.

Once the aligning of the display panel 110 and the glass cover 120 is completed, the display panel 110 and the glass cover 120 are compressed to insert the first flow prevention member 131 into the second flow prevention member 132.

In addition, when the display panel 110 and the glass cover 120 are compressed, the first flow prevention member 131 may be inserted into the inner space of the second flow prevention member 132. In this regard, the first flow prevention member 131 and the second flow prevention member 132 may be arranged to face each other.

In addition, when the first flow prevention member 131 is coupled to the second flow prevention member 132, the coupling member 140 may be inserted into the position determination member 150. Due to the inserting of the coupling member 140 into the position determination member 150, the display panel 110 and the glass cover 120 are accurately aligned.

During the compression of the display panel 110 and the glass cover 120, the adhesive member 160 may uniformly spread on a surface of the display panel 110. Here, the adhesive member 160 spreads on the surface of the display panel 110 until the adhesive member 160 meets the first flow prevention member 131.

In particular, since the first flow prevention member 131 covers the edge (or periphery) of the display panel 110, the adhesive member 160 does not spread onto the edge of the display panel 110 or out of the display panel 110.

Accordingly, regarding the display device 100 and the method of manufacturing the display device 100, when the glass cover 120 and the display panel 110 are attached to each other, leakage of the adhesive member 160 to the outside, or spreading of the adhesive member 160 over a designed (or predetermined) region may be prevented, and thus, a reliability of a formed product may be improved.

In addition, regarding the display device 100 and the method of manufacturing the display device 100, an additional process is not performed after the glass cover 120 and the display panel 110 are attached to each other, and thus, a process time may be reduced. Regarding the display device 100 and the method of manufacturing the display device 100, an additional coating of the glass cover 120 is not needed, and thus, the manufacturing costs of the display device 100 are reduced.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A display device comprising:
    a display panel;
    a cover on the display panel;
    an adhesive on at least one of the cover or the display panel to attach the cover to the display panel; and
    a flow prevention member on at least one of the display panel or the cover,
    wherein the flow prevention member has a groove at a central portion of the display device depressed from a surface of the flow prevention member, and
    wherein the adhesive is at an inner space of the flow prevention member.

2. The display device of claim 1, wherein the flow prevention member is at a periphery of the at least one of the display panel or the cover.

3. The display device of claim 1, wherein the flow prevention member comprises:
    a first flow prevention member on the display panel; and
    a second flow prevention member on the cover and conformably coupled to the first flow prevention member.

4. The display device of claim 3,
wherein at least one of the first flow prevention member or the second flow prevention member comprises a coupling member; and
wherein the other one of the first flow prevention member or the second flow prevention member has a position determination member that is coupled to the coupling member.

5. The display device of claim 1, wherein the flow prevention member is attached to the at least one of the display panel or the cover in a tape form.

6. The display device of claim 1, wherein the display panel comprises:
a first substrate;
an emission unit on the first substrate;
a second substrate coupled to the first substrate by a sealant that seals the emission unit from the outside; and
a light polarization member attached to a surface of the second substrate.

7. The display device of claim 6, wherein the display panel further comprises a touch pattern on the second substrate that is configured to enable touch recognition.

8. The display device of claim 1, wherein the cover comprises glass.

9. A method of manufacturing a display device, the method comprising:
attaching a flow prevention member having an inner space to at least one of a display panel or a cover;
placing an adhesive member into the inner space of the flow prevention member; and
attaching the cover to the display panel by compression,
wherein the flow prevention member has a groove at a central portion of the display device depressed from a surface of the flow prevention member.

10. The method of claim 9, wherein the adhesive member is radially applied from a center of the at least one of the display panel or the cover to which the flow prevention member is attached.

11. The method of claim 9, wherein the attaching of the flow prevention member comprises:
arranging a first flow prevention member on the display panel; and
arranging a second flow prevention member on the cover.

12. The method of claim 11, further comprising inserting one of the first flow prevention member or the second flow prevention member into the other one of the first flow prevention member or the second flow prevention member.

13. The method of claim 11, wherein the first flow prevention member and the second flow prevention member are respectively arranged on facing surfaces of the display panel and the cover.

14. The method of claim 9, wherein the flow prevention member is arranged on a periphery of the display panel or the cover.

15. The method of claim 9, wherein the display panel comprises
a first substrate;
an emission unit on the first substrate;
a second substrate coupled to the first substrate by a sealant that seals the emission unit from the outside; and
a light polarization member attached to a surface of the second substrate.

16. The method of claim 15, wherein the display panel further comprises a touch pattern on the second substrate and configured to enable touch recognition.

17. The method of claim 9, wherein the cover comprises glass.

\* \* \* \* \*